(12) United States Patent　　(10) Patent No.: US 12,571,843 B2

Marquez　　(45) Date of Patent: *Mar. 10, 2026

(54) BIT-CORRECTOR CIRCUITS FOR PHOTONIC CIRCUITS WITH CASCADED PHOTONIC GATES

(71) Applicant: Milkshake Technology Inc., Menlo Park, CA (US)

(72) Inventor: Bicky A. Marquez, Kingston (CA)

(73) Assignee: Milkshake Technology Inc., Menlo Park, CA (US)

( * ) Notice: Subject to any disclaimer, the term of this patent is extended or adjusted under 35 U.S.C. 154(b) by 22 days.

This patent is subject to a terminal disclaimer.

(21) Appl. No.: 18/675,732

(22) Filed: May 28, 2024

(65) Prior Publication Data

US 2024/0310438 A1　　Sep. 19, 2024

Related U.S. Application Data

(63) Continuation of application No. 18/120,308, filed on Mar. 10, 2023, now Pat. No. 12,032,023.

(51) Int. Cl.
　*G01R 31/3187*　　(2006.01)
　*G01R 31/317*　　(2006.01)
(52) U.S. Cl.
　CPC ..... *G01R 31/3187* (2013.01); *G01R 31/3171* (2013.01)
(58) Field of Classification Search
　CPC ........................ G01R 31/3187; G01R 31/3171
　See application file for complete search history.

(56) References Cited

U.S. PATENT DOCUMENTS

| | | | |
|---|---|---|---|
| 7,671,687 B2 | 3/2010 | LeChevalier | |
| 2002/0105690 A1* | 8/2002 | Hattori | ............. H04B 10/07953 |
| | | | 398/9 |

(Continued)

FOREIGN PATENT DOCUMENTS

WO　　WO 2022/262147 A1　　12/2022

OTHER PUBLICATIONS

PCT International Search Report and Written Opinion, PCT Application No. PCT/CA2024/050284, May 27, 2024, ten pages.

(Continued)

*Primary Examiner* — Thien Nguyen

(74) *Attorney, Agent, or Firm* — Fenwick & West LLP

(57)　　ABSTRACT

Embodiments of the present disclosure are directed to an integrated circuit with photonic bit-corrector circuits. The integrated circuit includes a photonic circuit, a photonic bit-corrector circuit, a photodetector array coupled to the photonic bit-corrector circuit, and an electronic circuit coupled to the photodetector array. The photonic circuit includes a plurality of cascaded photonic gates configured to generate a first photonic output signal for a set of photonic input signals applied to the photonic circuit. The photonic bit-corrector circuit is configured to generate a second photonic output signal for the set of photonic input signals applied to the photonic bit-corrector circuit. The photodetector array is configured to generate an electrical signal based on the second photonic output signal. The electronic circuit is configured to compare the electrical signal with a label signal and output a corrected version of the first photonic output signal based on the comparison.

20 Claims, 7 Drawing Sheets

(56)            References Cited

U.S. PATENT DOCUMENTS

| | | |
|---|---|---|
| 2005/0129348 A1 | 6/2005 | Iwasaki |
| 2016/0373138 A1* | 12/2016 | Li ........................ H04L 1/0009 |
| 2019/0318234 A1 | 10/2019 | Abel et al. |
| 2021/0398007 A1 | 12/2021 | Thompson et al. |
| 2024/0061282 A1 | 2/2024 | Xu et al. |

OTHER PUBLICATIONS

PCT International Search Report and Written Opinion, PCT Application No. PCT/US2024/022749, Jul. 17, 2024, 11 pages.

* cited by examiner

500

510

520

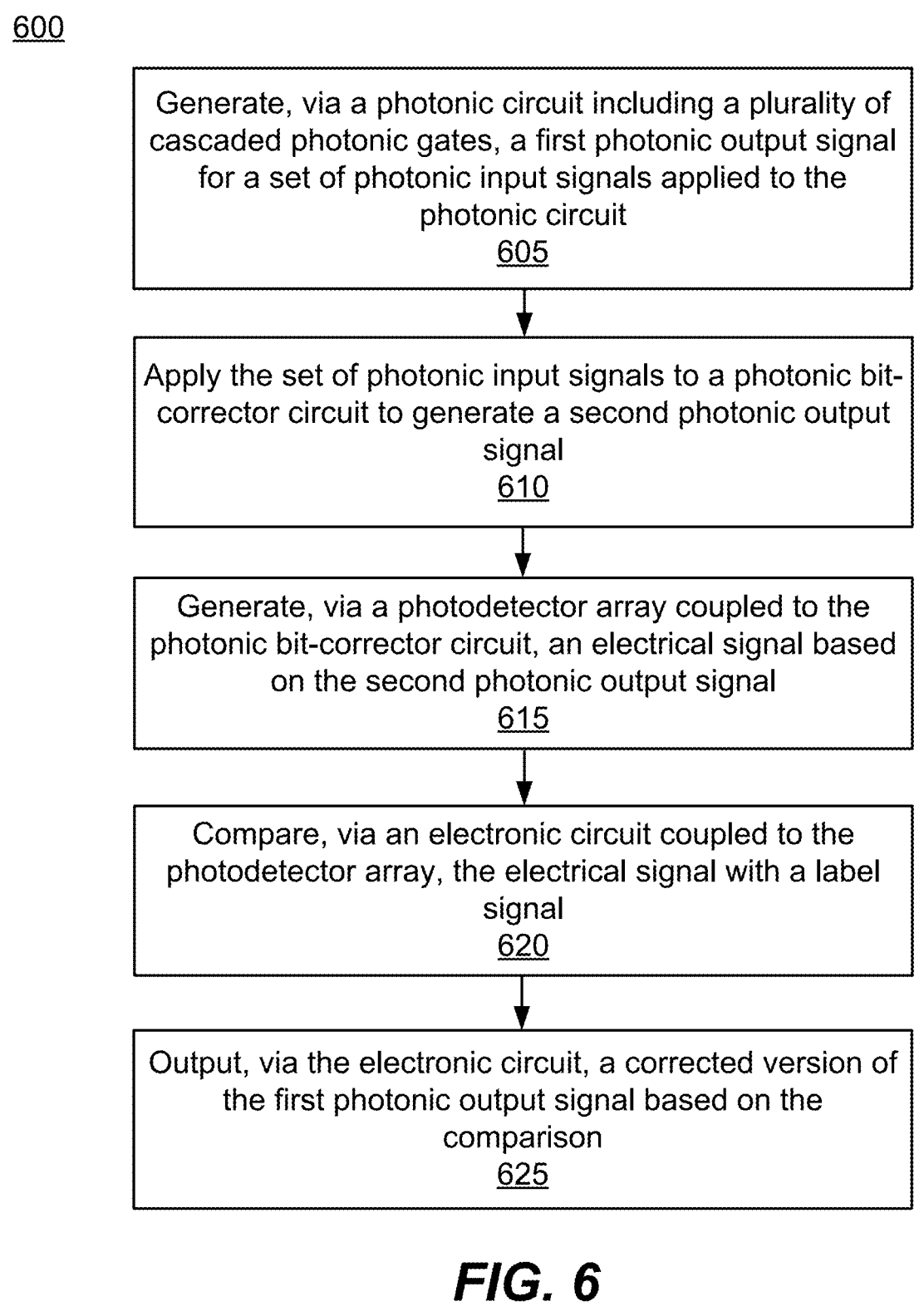

600

```
┌─────────────────────────────────────────────────┐
│  Generate, via a photonic circuit including a     │
│  plurality of cascaded photonic gates, a first    │
│  photonic output signal for a set of photonic     │
│  input signals applied to the photonic circuit    │
│                      605                          │
└─────────────────────────────────────────────────┘
                      ↓
┌─────────────────────────────────────────────────┐
│  Apply the set of photonic input signals to a     │
│  photonic bit-corrector circuit to generate a     │
│  second photonic output signal                    │
│                      610                          │
└─────────────────────────────────────────────────┘
                      ↓
┌─────────────────────────────────────────────────┐
│  Generate, via a photodetector array coupled to   │
│  the photonic bit-corrector circuit, an electrical │
│  signal based on the second photonic output       │
│  signal                                           │
│                      615                          │
└─────────────────────────────────────────────────┘
                      ↓
┌─────────────────────────────────────────────────┐
│  Compare, via an electronic circuit coupled to    │
│  the photodetector array, the electrical signal   │
│  with a label signal                              │
│                      620                          │
└─────────────────────────────────────────────────┘
                      ↓
┌─────────────────────────────────────────────────┐
│  Output, via the electronic circuit, a corrected  │
│  version of the first photonic output signal      │
│  based on the comparison                          │
│                      625                          │
└─────────────────────────────────────────────────┘
```

*FIG. 6*

BIT-CORRECTOR CIRCUITS FOR PHOTONIC CIRCUITS WITH CASCADED PHOTONIC GATES

CROSS-REFERENCE TO RELATED APPLICATION

This application is a continuation of U.S. application Ser. No. 18/120,308, filed Mar. 10, 2023, which is incorporated by reference herein for all purposes.

TECHNICAL FIELD

The present disclosure generally relates to a processor architecture and, more specifically, to bit-corrector circuits for photonic circuits with cascaded photonic gates.

BACKGROUND

Photonic hardware is favorable for applications requiring a high bandwidth, low latency, and low switching energy for signal processing and data communications. Recent innovations in silicon photonic fabrication have enabled the on-chip implementation of photonic circuits. This has opened a low-cost, high-precision, and scalable avenue for the development of photonic computing. Advances in photonic computing have demonstrated suitability for applications requiring high-bandwidth parallel processing, especially neural networks, offering higher speed and less energy consumption than equivalent networks implemented in digital electronics.

Circuitry for photonic computing typically employs a series of cascaded photonic gates. Different phases of optical signals (i.e., light signals) processed by the cascaded photonic gates can cause accumulative errors within the photonic circuitry. Each accumulative error that may occur within the photonic circuit can be corrected by directly coupling a thresholder circuit to a respective connection within the cascaded photonic gates in the photonic circuitry where that accumulative error can occur. However, thresholder circuits are expensive both computationally and area-wise.

SUMMARY

Embodiments of the present disclosure are directed to an integrated circuit that uses photonic bit-corrector circuits to correct errors within photonic circuitry with cascaded photonic gates. The integrated circuit comprises a photonic circuit, a photonic bit-corrector circuit, a photodetector array coupled to the photonic bit-corrector circuit, and an electronic circuit coupled to the photodetector array. The photonic circuit includes a plurality of cascaded photonic gates configured to generate a first photonic output signal for a set of photonic input signals applied to the photonic circuit. The photonic bit-corrector circuit is configured to generate a second photonic output signal for the set of photonic input signals applied to the photonic bit-corrector circuit. The photodetector array generates an electrical signal based on the second photonic output signal. The electronic circuit is configured to compare the electrical signal with a label signal and output a corrected version of the first photonic output signal based on the comparison.

Embodiments of the present disclosure are further directed to a non-transitory computer-readable storage medium comprising stored instructions that, when executed by at least one processor, cause the at least one processor to:

instruct a photonic circuit including a plurality of cascaded photonic gates to generate a first photonic output signal for a set of photonic input signals applied to the photonic circuit; apply the set of photonic input signals to a photonic bit-corrector circuit to generate a second photonic output signal; instruct a photodetector array coupled to the photonic bit-corrector circuit to generate an electrical signal based on the second photonic output signal; instruct an electronic circuit coupled to the photodetector array to compare the electrical signal with a label signal; and instruct the electronic circuit to output a corrected version of the first photonic output signal based on the comparison.

Embodiments of the present disclosure are further directed to a method for operating an integrated circuit that uses photonic bit-corrector circuits to correct errors within photonic circuitry with cascaded photonic gates. The method comprises: generating, via a photonic circuit including a plurality of cascaded photonic gates, a first photonic output signal for a set of photonic input signals applied to the photonic circuit; applying the set of photonic input signals to a photonic bit-corrector circuit to generate a second photonic output signal; generating, via a photodetector array coupled to the photonic bit-corrector circuit, an electrical signal based on the second photonic output signal; comparing, via an electronic circuit coupled to the photodetector array, the electrical signal with a label signal; and outputting, via the electronic circuit, a corrected version of the first photonic output signal based on the comparison.

BRIEF DESCRIPTION OF THE DRAWINGS

Figure (FIG.) 1 illustrates an example block diagram of an integrated circuit with a photonic circuit of cascaded photonic gates, a photonic bit-corrector circuit, and an electronic bit-corrector circuit, in accordance with some embodiments.

FIG. 6 is a flowchart illustrating an example method for correcting errors in a photonic circuit with cascaded photonic gates using a photonic bit-corrector circuit, in accordance with some embodiments.

The figures depict embodiments of the present disclosure for purposes of illustration only. One skilled in the art will readily recognize from the following description that alternative embodiments of the structures and methods illustrated herein can be employed without departing from the principles or benefits touted by the disclosure described herein.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that can be employed without departing from the principles of what is claimed.

Reference will now be made in detail to several embodiments, examples of which are illustrated in the accompanying figures. It is noted that wherever practicable, similar or like reference numbers can be used in the figures and can indicate similar or like functionality. The figures depict embodiments of the disclosed system (or method) for illustration only. One skilled in the art will readily recognize from the following description that alternative embodiments of the structures and methods illustrated herein can be employed without departing from the principles described herein.

Embodiments of the present disclosure are directed to utilizing bit-corrector circuits to efficiently correct errors that may occur at a photonic circuit with cascaded photonic gates. The photonic circuit with the cascaded photonic gates may generate a first photonic output signal for a set of photonic input signals. A photonic bit-corrector circuit may generate a second photonic output signal for the same set of photonic input signals. An electronic bit-corrector circuit may be applied to compare an electrical version of the second photonic output signal with a label signal and generate a corrected version of the first photonic output signal based on the comparison.

Integrated Circuit with Photonic Circuit and Bit-Correctors

Figure 1:
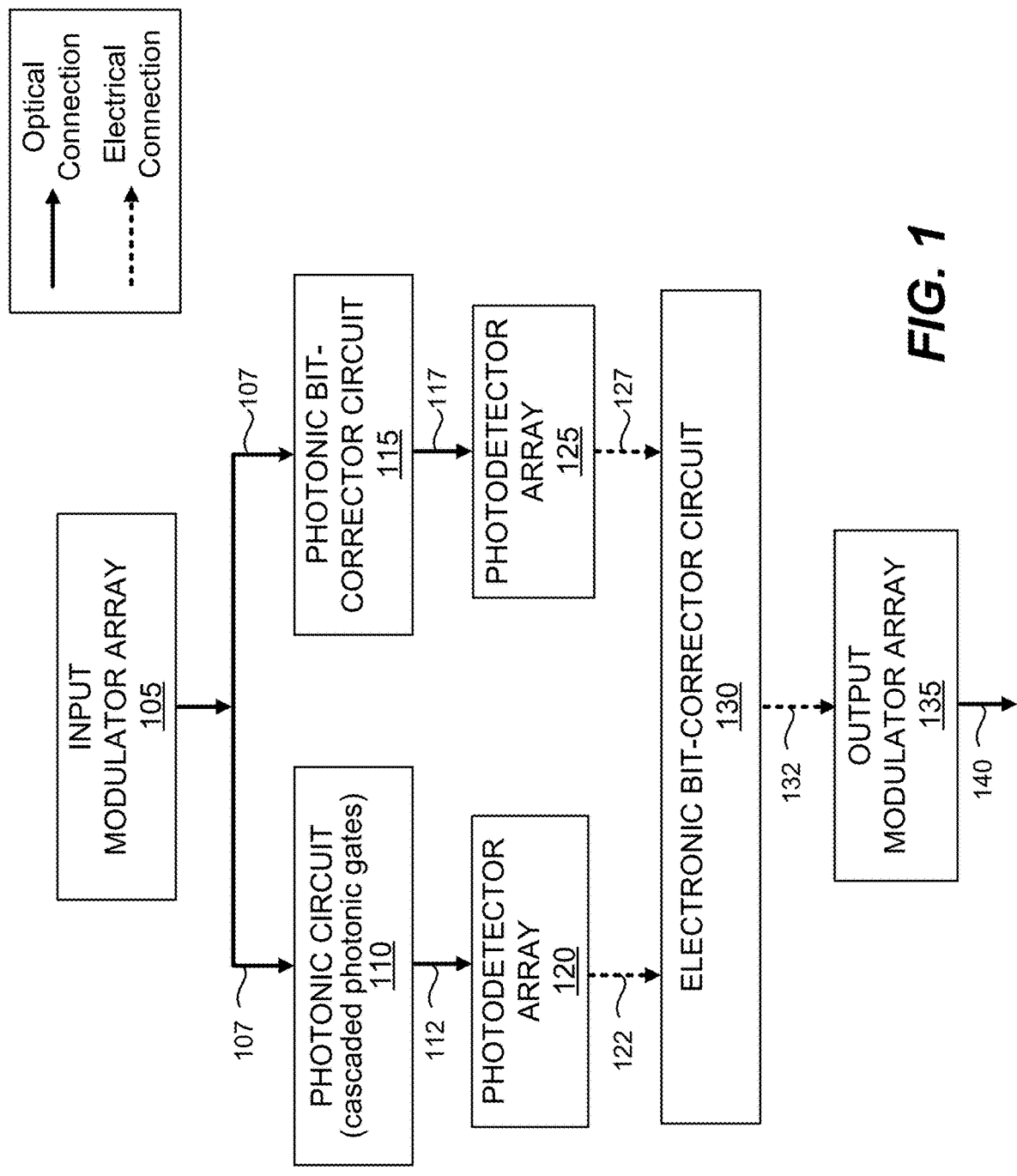

Figure (FIG.) 1 illustrates an example block diagram of an integrated circuit 100 with a photonic circuit of cascaded photonic gates, a photonic bit-corrector circuit, and an electronic bit-corrector circuit, in accordance with some embodiments. The integrated circuit 100 may include an input modulator array 105, a photonic circuit 110, a photonic bit-corrector circuit 115, a photodetector array 120, a photodetector array 125, an electronic bit-corrector circuit 130, and an output modulator array 135. The integrated circuit 100 may include fewer or additional components not shown in FIG. 1.

The input modulator array 105 may receive electrical input signals (not shown in FIG. 1) and generate a set of photonic input signals 107 based on the received electrical input signals. The set of photonic input signals 107 may be thus applied to the photonic circuit 110 and the photonic bit-corrector circuit 115 via the input modulator array 105. The input modulator array 105 may transmit the set of photonic input signals 107 to the photonic circuit 110 via a first set of optical connections. The input modulator array 105 may transmit the set of photonic input signals 107 to the photonic bit-corrector circuit 115 via a second set of optical connections. The input modulator array 105 may include an array of photonic intensity modulators with outputs coupled to the photonic circuit 110 and the photonic bit-corrector circuit 115. The array of photonic intensity modulators in the input modulator array 105 may be implemented as, e.g., an array of electro-optic effect modulators, an array of carrier-depletion effect modulators, and/or an array of thermo-optic effect modulators.

The photonic circuit 110 may generate a photonic output signal 112 for the set of photonic input signals 107 applied to one or more inputs of the photonic circuit 110. The photonic circuit 110 may execute different operations (e.g., instructions) on the set of photonic input signals 107 represented as pulses of light (e.g., optical data). The photonic circuit 110 may be configured for the execution of various algorithms, e.g., machine learning algorithms, secure hash algorithms, etc. The photonic circuit 110 may be implemented on a silicon photonics platform. The photonic circuit 110 may include a plurality of cascaded photonic gates. The photonic circuit 110 may include photonic components (e.g., photonic crystals or inverse-designed structures), optical interconnects, active photonic components (e.g., modulators, photodetectors), passive photonic components (e.g., couplers, resonators, logic gates), three-dimensional waveguides (e.g., designed on silicon-based dual layer wafers or silicon-nitride-based dual layer wafers), some other photonic components, or some combination thereof. The photonic circuit 110 may utilize wavelength-division multiplexing, time-division multiplexing, mode-division multiplexing, some other multiplexing technique, or some combination thereof. The photonic circuit 110 may transmit the photonic output signal 112 to the photodetector array 120.

The photonic bit-corrector circuit 115 may generate a photonic output signal 117 for the set of photonic input signals 107 applied to one or more inputs of the photonic bit-corrector circuit 115. Thus, the same set of photonic input signals 107 may be applied to both the photonic circuit 110 and the photonic bit-corrector circuit 115. The photonic bit-corrector circuit 115 may be a photonic circuit configured to generate the photonic output signal 117 corresponding to a label signal for the set of photonic input signals 107 applied to the photonic bit-corrector circuit 115. The label signal may have a specific (constant) value. In such a case, the amplitude of the photonic output signal 117 may be equal to the amplitude of the label signal, e.g., to the constant value. Alternatively, the label signal may include a range of numbers. In such a case, the amplitude of the photonic output signal 117 generated by the photonic bit-corrector circuit 115 may be within the range of numbers defined by the label signal. The photonic bit-corrector circuit 115 may transmit the photonic output signal 117 to the photodetector array 125.

The photodetector array 120 may generate an electrical signal 122 based on the photonic output signal 112 generated by the photonic circuit 110. The photodetector array 120 may transmit the electrical signal 122 to the electronic bit-corrector circuit 130. The photodetector array 125 may generate an electrical signal 127 based on the photonic output signal 117 generated by the photonic bit-corrector circuit 115. The photodetector array 125 may transmit the electrical signal 127 to the electronic bit-corrector circuit 130. An input of the electronic bit-corrector circuit 130 may be thus directly connected to an output of the photodetector array 120 and an output of the photodetector array 125.

Figure 2:
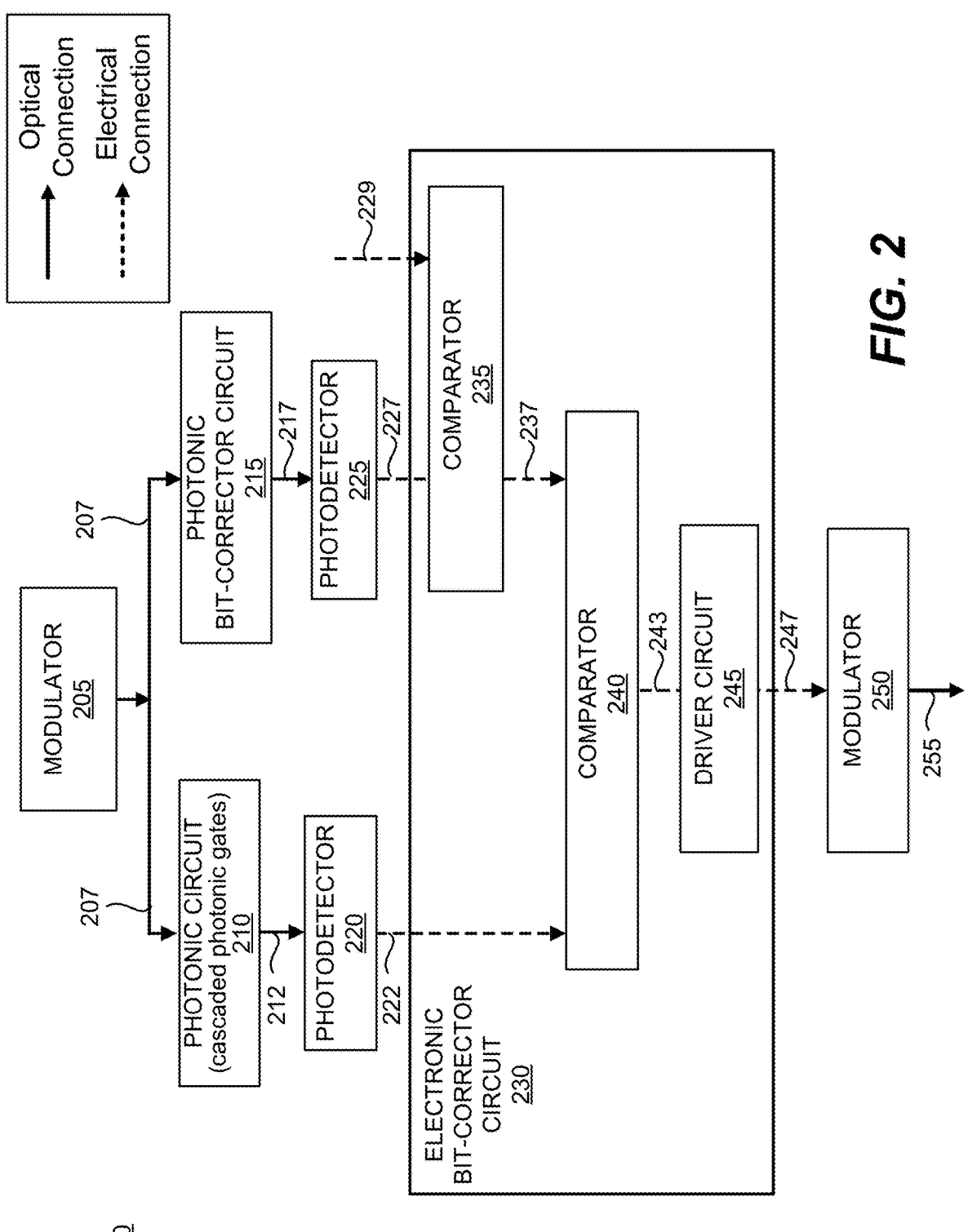
FIG. 2 illustrates an example block diagram of an integrated circuit with a photonic circuit of cascaded photonic gates, a photonic bit-corrector circuit, and an electronic bit-corrector circuit with a pair of comparators and a driver circuit, in accordance with some embodiments.
Figure 3:
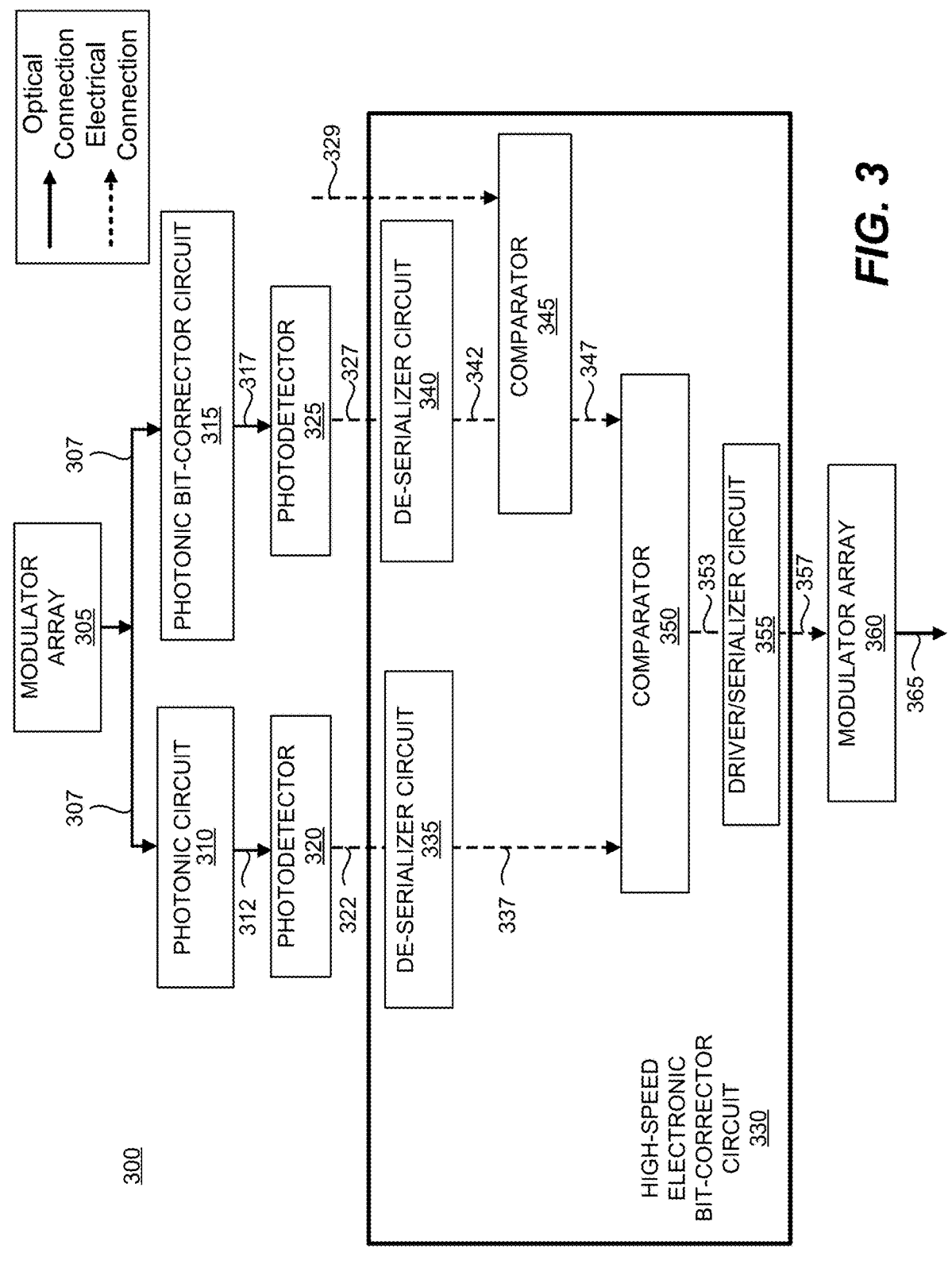
FIG. 3 illustrates an example block diagram of an integrated circuit with a photonic circuit of cascaded photonic gates, a photonic bit-corrector circuit, and an electronic bit-corrector circuit with comparators, high-speed de-serializers, and a driver circuit, in accordance with some embodiments.

The electronic bit-corrector circuit 130 may compare the electrical signal 122 with the electrical signal 127 (e.g., label signal) and generate an electrical output signal 132, based on the comparison. When the electrical signal 122 is different from the electrical signal 127 (i.e., the electrical signal 122 is different from the label signal), an error that occurred in the photonic circuit 110 may be detected. In such case, the electronic bit-corrector circuit 130 may generate the electrical output signal 132 as a corrected version (e.g., corrected electrical version) of the photonic output signal 112. The electronic bit-corrector circuit 130 may be configured to, e.g., flip at least one bit in the digital electrical signal 122 based on the comparison with the digital electrical signal 127 to generate the electrical output signal 132. In one embodiment, the electronic bit-corrector circuit 130 may include at least one comparator and amplifier circuit. In another embodiment (e.g., as illustrated in FIG. 2), the electronic bit-corrector circuit 130 may include a pair of comparators and a driver circuit. In yet another embodiment (e.g., as illustrated in FIG. 3), the electronic bit-corrector circuit 130 may include a pair of comparator circuits, a driver circuit with a serializer, and a pair of de-serializer circuits. The electronic bit-corrector circuit 130 may transmit the electrical output signal 132 to the output modulator array 135.

The output modulator array 135 may generate a photonic output signal 140 based on the electrical output signal 132. The photonic output signal 140 may represent the corrected version of the photonic output signal 112 generated by the photonic circuit 110. The output modulator array 135 may transmit the photonic output signal 140 to another photonic circuit (e.g., with cascaded photonic gates) via a second set of optical connections (not shown in FIG. 1). The output modulator array 135 may include an array of photonic intensity modulators with inputs coupled to an output of the electronic bit-corrector circuit 130. The array of photonic intensity modulators in the output modulator array 135 may be implemented as, e.g., an array of electro-optic effect modulators, an array of carrier-depletion effect modulators, and/or an array of thermo-optic effect modulators.

FIG. 2 illustrates an example block diagram of an integrated circuit 200 with bit-correction, in accordance with some embodiments. The integrated circuit 200 may include a modulator 205, a photonic circuit 210, a photonic bit-corrector circuit 215, a photodetector 220, a photodetector 225, an electronic bit-corrector circuit 230, and a modulator 250. As shown in FIG. 2, the electronic bit-corrector circuit 230 may include a pair of cascaded comparators 235, 240, and a driver circuit 245. The integrated circuit 200 may include fewer or additional components not shown in FIG. 2.

The modulator 205 may receive electrical input signals (not shown in FIG. 2) and generate a set of photonic input signals 207 based on the received electrical input signals. The set of photonic input signals 207 may be thus applied to the photonic circuit 210 and the photonic bit-corrector circuit 215 via the modulator 205. The modulator 205 may transmit the set of photonic input signals 207 to the photonic circuit 210 via a first set of optical connections. The modulator 205 may transmit the set of photonic input signals 207 to the photonic bit-corrector circuit 215 via a second set of optical connections. The modulator 205 may include at least one photonic intensity modulator with at least one output coupled to the photonic circuit 210 and the photonic bit-corrector circuit 215. At least one photonic intensity modulator in the modulator 205 may be implemented as, e.g., at least one electro-optic effect modulator, at least one carrier-depletion effect modulator, and/or at least one thermo-optic effect modulator.

The photonic circuit 210 may generate a photonic output signal 212 for the set of photonic input signals 207 applied to one or more inputs of the photonic circuit 210. The photonic circuit 210 may execute different operations (i.e., instructions) on the set of photonic input signals 207 represented as pulses of light (i.e., optical data). The photonic circuit 210 may be configured for the execution of various algorithms, e.g., machine learning algorithms, secure hash algorithms, etc. The photonic circuit 210 may be implemented on a silicon photonics platform. The photonic circuit 210 may include a plurality of cascaded photonic gates. The photonic circuit 210 may include photonic components (e.g., photonic crystals or inverse-designed structures), optical interconnects, active photonic components (e.g., modulators, photodetectors), passive photonic components (e.g., couplers, resonators, logic gates), three-dimensional waveguides (e.g., designed on silicon-based dual layer wafers or silicon-nitride-based dual layer wafers), some other photonic components, or some combination thereof. The photonic circuit 210 may utilize wavelength-division multiplexing, time-division multiplexing, mode-division multiplexing, some other multiplexing technique, or some combination thereof. The photonic circuit 210 may transmit the photonic output signal 212 to the photodetector 220.

The photonic bit-corrector circuit 215 may generate a photonic output signal 217 for the set of photonic input signals 207 applied to one or more inputs of the photonic bit-corrector circuit 215. Thus, the same set of photonic input signals 207 may be applied to both the photonic circuit 210 and the photonic bit-corrector circuit 215. The photonic bit-corrector circuit 215 may be a photonic circuit configured to generate the photonic output signal 217 that corresponds to a label signal for the set of photonic input signals 207 applied to the photonic bit-corrector circuit 215. The label signal may have a specific (constant) value. In such a case, the amplitude of the photonic output signal 217 may be equal to the amplitude of the label signal, e.g., to the constant value. Alternatively, the label signal may include a range of numbers. In such a case, the amplitude of the photonic output signal 217 may be within the range of numbers defined by the label signal. The photonic bit-corrector circuit 215 may transmit the photonic output signal 217 to the photodetector 225.

The photodetector 220 may generate a digital electrical signal 222 based on the photonic output signal 212 generated by the photonic circuit 210. The digital electrical signal 222 may be, e.g., a digital bit signal "O1", which is either logical "0" or logical "1". The photodetector 220 may transmit the digital electrical signal 222 to the electronic bit-corrector circuit 230.

The photodetector 225 may generate an electrical signal 227 based on the photonic output signal 217 generated by the photonic bit-corrector circuit 215. The electrical signal 227 may be an analog electrical signal or a digital electrical signal. The electrical signal 227 may be, e.g., an electrical signal "O2", which is either logical "0" or have an analog value "VAL" of an electrical label signal 229 input into a comparator 235 of the electronic bit-corrector circuit 230. The photodetector 225 may transmit the electrical signal 227 to the electronic bit-corrector circuit 230, and more specifically, to the comparator 235. Inputs of the electronic bit-corrector circuit 230 may be thus directly connected to an output of the photodetector 220 and an output of the photodetector 225.

The electronic bit-corrector circuit 230 may compare the electrical signals 222 and 227 with the label signal 229 and generate an electrical output signal 247 based on the comparisons. The electrical output signal 247 may be a corrected version (e.g., an electrical corrected version) of the photonic output signal 212 generated by the photonic circuit 210. The electronic bit-corrector circuit 230 may include the comparator 235, the comparator 240, and the driver circuit 245. The electronic bit-corrector circuit 230 may include one or more additional components (e.g., at least one amplifier circuit) not shown in FIG. 2. The electronic bit-corrector circuit 230 may be an embodiment of the electronic bit-corrector circuit 130.

The comparator 235 may compare the electrical signal 227 with the label signal 229. If the electrical signal 227 is different from the label signal 229, the comparator 235 may produce an electrical signal 237 that is equal to, e.g., logical "0". Otherwise, if the electrical signal 227 is substantially the same as the label signal 229 (e.g., an amplitude of the electrical signal 227 is within a threshold from the value "VAL" of the electrical label signal 229), the comparator 235 may produce the electrical signal 237 equal to the label signal 229. The comparator 235 may transmit the electrical signal 237 to an input of the comparator 240. Additionally, the photodetector 220 may transmit the electrical signal 222 to another input of the comparator 240.

The comparator 240 may compare the electrical signal 222 with the electrical signal 237 (i.e., logical "0" or the label signal 229) generated by the comparator 235. If the electrical signal 222 is less than the electrical signal 237, the comparator 240 may produce an electrical signal 243 that is equal to, e.g., logical "1". Otherwise, the comparator 240 may produce the electrical signal 243 that is equal to, e.g., logical "0". The electrical signal 243 produced by the comparator 240 may represent a corrected version (i.e., electrical corrected version) of the photonic output signal 212 generated by the photonic circuit 210. The comparator 240 may transmit the electrical signal 243 to the driver circuit 245.

The driver circuit 245 may generate the electrical output signal 247 based on the electrical signal 243. The electrical output signal 247 may be an amplified version of the electrical signal 243 suitable for being input into the modulator 250. The driver circuit 245 may be implemented as, e.g., a micro-ring modulator.

The modulator 250 may generate a photonic output signal 255 based on the electrical output signal 247. The photonic output signal 255 may represent the corrected version of the photonic output signal 212 generated by the photonic circuit 210. The modulator 250 may transmit the photonic output signal 255 to another photonic circuit (e.g., with cascaded photonic gates) via a second set of optical connections (not shown in FIG. 2). The modulator 250 may include at least one photonic intensity modulator with at least one input coupled to an output of the electronic bit-corrector circuit 230. At least one photonic intensity modulator in the modulator 250 may be implemented as, e.g., at least one electro-optic effect modulator, at least one carrier-depletion effect modulator, and/or at least one thermo-optic effect modulator.

FIG. 3 illustrates an example block diagram of an integrated circuit 300 with high-speed bit-correction, in accordance with some embodiments. The integrated circuit 300 may include a modulator array 305, a photonic circuit 310, a photonic bit-corrector circuit 315, a photodetector 320, a photodetector 325, a high-speed electronic bit-corrector circuit 330, and a modulator array 360. As shown in FIG. 3, the high-speed electronic bit-corrector circuit 330 may include a pair of de-serializer circuits 335, 340, a pair of cascaded comparators 345, 350, and a driver/serializer circuit 355. The integrated circuit 300 may include fewer or additional components not shown in FIG. 3.

The modulator array 305 may receive electrical input signals (not shown in FIG. 3) and generate a set of photonic input signals 307 based on the received electrical input signals. The set of photonic input signals 307 may be applied to the photonic circuit 310 and the photonic bit-corrector circuit 315 via the modulator array 305. The modulator array 305 may transmit the set of photonic input signals 307 to the photonic circuit 310 via a first set of optical connections. The modulator array 305 may transmit the set of photonic input signals 307 to the photonic bit-corrector circuit 315 via a second set of optical connections. The modulator array 305 may include an array of photonic intensity modulators (e.g., N photonic intensity modulators) with outputs coupled to the photonic circuit 310 and the photonic bit-corrector circuit 315. The array of photonic intensity modulators in the modulator array 305 may be implemented as, e.g., an array of electro-optic effect modulators, an array of carrier-depletion effect modulators, and/or an array of thermo-optic effect modulators.

The photonic circuit 310 may generate a photonic output signal 312 for the set of photonic input signals 307 applied to one or more inputs of the photonic circuit 310. The photonic circuit 310 may execute different operations (e.g., instructions) on the set of photonic input signals 307 represented as pulses of light (e.g., optical data). The photonic circuit 310 may be configured for the execution of various algorithms, e.g., machine learning algorithms, secure hash algorithms, etc. The photonic circuit 310 may be implemented on a silicon photonics platform. The photonic circuit 310 may include a plurality of cascaded photonic gates. The photonic circuit 310 may include photonic components (e.g., photonic crystals or inverse-designed structures), optical interconnects, active photonic components (e.g., modulators, photodetectors), passive photonic components (e.g., couplers, resonators, logic gates), three-dimensional waveguides (e.g., designed on silicon-based dual layer wafers or silicon-nitride-based dual layer wafers), some other photonic components, or some combination thereof. The photonic circuit 310 may utilize wavelength-division multiplexing, time-division multiplexing, mode-division multiplexing, some other multiplexing technique, or some combination thereof. The photonic circuit 310 may transmit the photonic output signal 312 to the photodetector 320.

The photonic bit-corrector circuit 315 may generate a photonic output signal 317 for the set of photonic input signals 307 applied to one or more inputs of the photonic bit-corrector circuit 315. Thus, the same set of photonic input signals 307 may be applied to both the photonic circuit 310 and the photonic bit-corrector circuit 315. The photonic bit-corrector circuit 315 may be a photonic circuit configured to generate the photonic output signal 317 that corresponds to a label signal for the set of photonic input signals 307 applied to the photonic bit-corrector circuit 315. The label signal may have a specific (constant) value. In such a case, the amplitude of the photonic output signal 317 may be equal to the amplitude of the label signal, e.g., to the constant value. Alternatively, the label signal may include a range of numbers. In such a case, the amplitude of the photonic output signal 317 may be within the range of numbers defined by the label signal. The photonic bit-corrector circuit 315 may transmit the photonic output signal 317 to the photodetector 325.

The photodetector 320 may generate a digital electrical signal 322 based on the photonic output signal 312 generated by the photonic circuit 310. The digital electrical signal 322 may be, e.g., a digital bit signal "O1", which is either logical "0" or logical "1". The photodetector 320 may transmit the digital electrical signal 322 to the electronic bit-corrector circuit 330.

The photodetector 325 may generate an electrical signal 327 based on the photonic output signal 317 generated by the photonic bit-corrector circuit 315. The electrical signal 327 may be an analog electrical signal or a digital electrical signal. The electrical signal 327 may be, e.g., an electrical signal "O2", which is either logical "0" or have an analog value "VAL" of an electrical label signal 329 input into a comparator 345 of the electronic bit-corrector circuit 330. The photodetector 325 may transmit the electrical signal 327 to the electronic bit-corrector circuit 330. Inputs of the electronic bit-corrector circuit 330 may be thus directly connected to an output of the photodetector 320 and an output of the photodetector 325.

The electronic bit-corrector circuit 330 may compare the electrical signals 322 and 327 with the label signal 329 and generate an electrical output signal 357 based on the comparisons. The electrical output signal 357 may be a corrected version (e.g., an electrical corrected version) of the photonic output signal 312 generated by the photonic circuit 310. The electronic bit-corrector circuit 330 may include de-serializer circuits 335, 340, comparators 345, 350, and a driver/serializer circuit 355. The electronic bit-corrector circuit 330 may include one or more additional components (e.g., at least one amplifier circuit) not shown in FIG. 3. The electronic bit-corrector circuit 330 may be an embodiment of the electronic bit-corrector circuit 130.

The de-serializer circuit 335 may generate an electrical signal 337 (e.g., a lower speed electrical signal) based on the received high-speed electrical signal 322, and the electrical signal 337 may be a de-serialized version of the electrical signal 322. The de-serializer circuit 335 may be configured to de-serialize the high-speed electrical signal 322 generated by the cascade connection of the photonic circuit 310 and the photodetector 320. A rate of the high-speed electrical signal 322 may be equal to, e.g., N times a speed of a photonic intensity modulator in the modulator array 305, where N is the number of photonic intensity modulators in the modulator array 305. The de-serializer circuit 335 may generate the electrical signal 337 having a rate lower than that of the electrical signal 322, which is more suitable for operations of the comparator 350 that is typically slower than the cascade connection of the photonic circuit 310 and the photodetector 320. The de-serializer circuit 335 may transmit the electrical signal 337 to the comparator 350.

The de-serializer circuit 340 may generate an electrical signal 342 (e.g., a lower speed electrical signal) based on the received high-speed electrical signal 327, and the electrical signal 342 may be a de-serialized version of the electrical signal 327. The de-serializer circuit 340 may be configured to de-serialize the high-speed electrical signal 327 generated by the cascade connection of the photonic bit-corrector circuit 315 and the photodetector 325. A rate of the high-speed electrical signal 327 may be equal to, e.g., N times a speed of a photonic intensity modulator in the modulator array 305, where N is the number of photonic intensity modulators in the modulator array 305. The de-serializer circuit 340 may generate the electrical signal 342 having a rate lower than that of the electrical signal 327, which is more suitable for operations of the comparator 345 that is slower than the cascade connection of the photonic bit-corrector circuit 315 and the photodetector 325. The de-serializer circuit 340 may transmit the electrical signal 342 to the comparator 345.

The comparator 345 may compare the electrical signal 342 with the label signal 329. If the electrical signal 342 is different from the label signal 329, the comparator 345 may produce an electrical signal 347 that is equal to, e.g., logical "0". Otherwise, if the electrical signal 342 is substantially the same as the label signal 329 (e.g., an amplitude of the electrical signal 342 is within a threshold from the value "VAL" of the electrical label signal 329), the comparator 345 may produce the electrical signal 347 equal to the label signal 329. The comparator 345 may transmit the electrical signal 347 to an input of the comparator 350. Additionally, the de-serializer circuit 340 may transmit the electrical signal 337 to another input of the comparator 350.

The comparator 350 may compare the electrical signal 337 with the electrical signal 347 (i.e., logical "0" or the label signal 329) generated by the comparator 345. If the electrical signal 337 is less than the electrical signal 347, the comparator 350 may produce an electrical signal 353 that is equal to, e.g., logical "1". Otherwise, the comparator 350 may produce the electrical signal 353 that is equal to, e.g., logical "0". The electrical signal 353 produced by the comparator 350 may represent a corrected version (i.e., an electrical corrected version) of the photonic output signal 312 generated by the photonic circuit 310. The comparator 350 may transmit the electrical signal 353 to the driver circuit 355.

The driver/serializer circuit 355 may generate the high-speed electrical output signal 357 based on the electrical signal 353. The electrical output signal 357 may be an amplified version of the electrical signal 353 having a rate higher than that of the electrical signal 353 suitable for being input into the modulator array 360. The driver/serializer circuit 355 may be implemented as, e.g., an array of N micro-ring modulators.

The modulator array 360 may generate a photonic output signal 365 based on the electrical output signal 357. The photonic output signal 365 may represent the corrected version of the photonic output signal 312 generated by the photonic circuit 310. The modulator array 360 may transmit the photonic output signal 365 to another photonic circuit (e.g., with cascaded photonic gates) via a second set of optical connections (not shown in FIG. 3). The modulator array 360 may include an array of photonic intensity modulators (e.g., N photonic intensity modulators) with inputs coupled to an output of the electronic bit-corrector circuit 330. The array of photonic intensity modulators in the modulator array 360 may be implemented as, e.g., an array of electro-optic effect modulators, an array of carrier-depletion effect modulators, and/or an array of thermo-optic effect modulators.

Examples of Photonic Circuit and Photonic
Bit-Corrector Circuits

Bit-corrector circuits may be utilized for correcting errors in various photonic circuits with cascaded photonic gates. One example of a photonic circuit with cascaded photonic gates that employs bit-corrector circuits for correcting errors is presented in relation to FIG. 4. Examples of bit-corrector circuits that can be utilized for correcting errors in the photonic circuit of FIG. 4 are described in relation to FIGS. 5A-5C.

Figure 4:
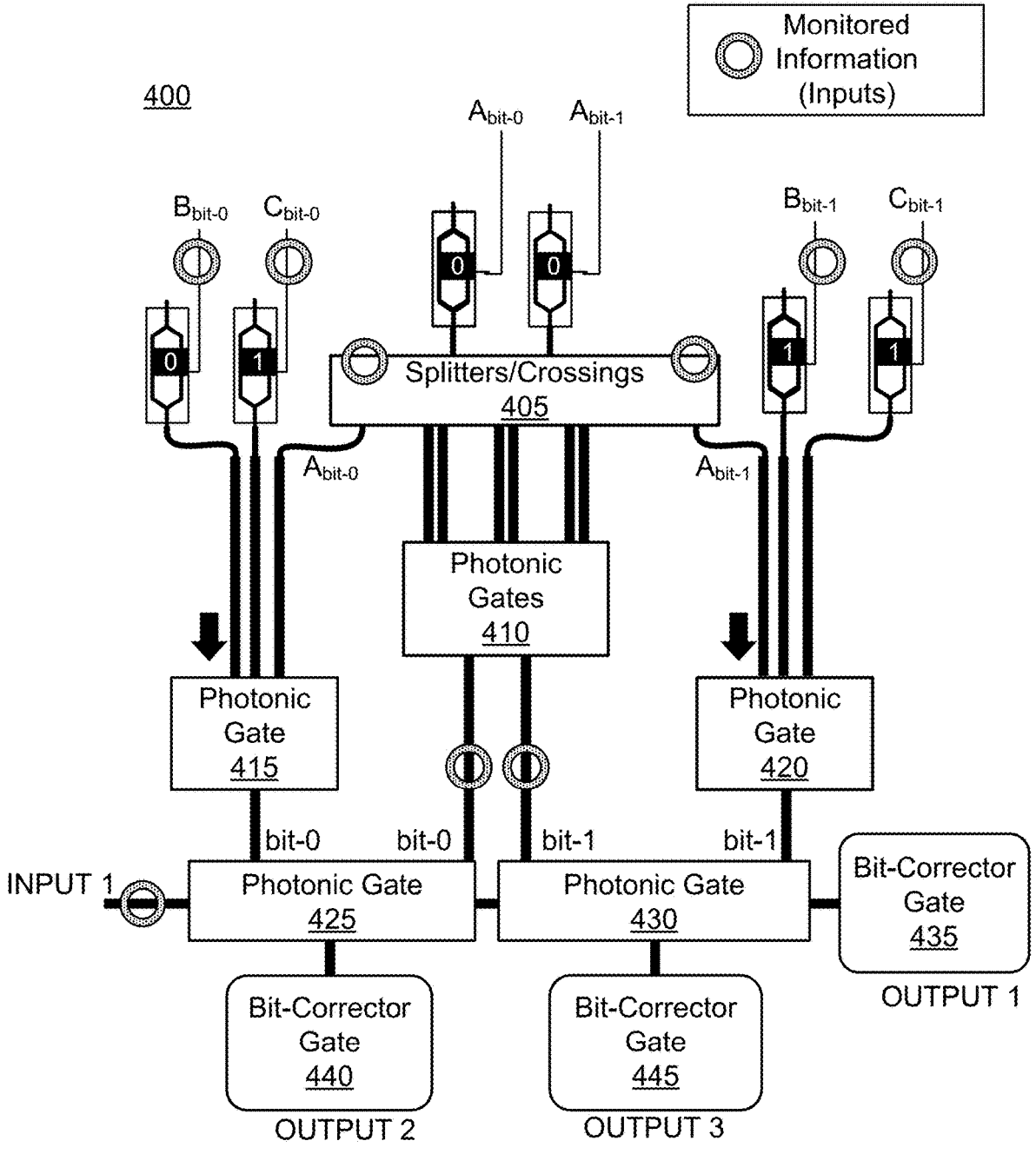
FIG. 4 illustrates an example photonic circuit of cascaded photonic gates coupled to photonic bit-corrector gates, in accordance with some embodiments.

FIG. 4 illustrates an example photonic circuit 400 of cascaded photonic gates coupled to photonic bit-corrector gates, in accordance with some embodiments. The photonic circuit 400 may include multiple photonic inputs (e.g., $A_1A_0$, $B_1B_0$, $C_1C_0$) provided to cascaded connections (i.e., direct connections) of photonic splitters/crossings 405 (e.g., with photonic shifters), photonic gates 410 (e.g., photonic XOR logic gates), a pair of photonic gates 415, 420 (e.g., photonic majority logic gates), and a pair of photonic gates 425, 430 (e.g., photonic full adders). The photonic circuit 400 may be an embodiment of the photonic circuit 110, the photonic circuit 210, or the photonic circuit 310.

As shown in FIG. 4, some optical signals within the photonic circuit 400 (e.g., inputs to the photonic circuit 400) can be monitored. However, some other optical signals within the photonic circuit 400 cannot be monitored. Some unmonitored optical signals may need to be corrected, e.g., due to the accumulation of different phases of the optical signals. To correct these accumulative errors, photonic bit-corrector gates 435, 440, and 445 may be coupled to the outputs of the photonic circuit 400. For example, a photonic bit-corrector gate 435 may be coupled to an output 1 of the photonic gate 430 (e.g., a carry output of a first photonic full adder) to correct a possible bit error in the output 1; a photonic bit-corrector gate 440 may be coupled to an output 2 of the photonic gate 425 (e.g., an output sum of a second photonic full adder) to correct a possible bit error in the output 2; and a photonic bit-corrector gate 445 may be coupled to an output 3 of the photonic gate 430 to correct a possible bit error in the output 3 (e.g., an output sum of the first photonic full adder).

Figure 5A:
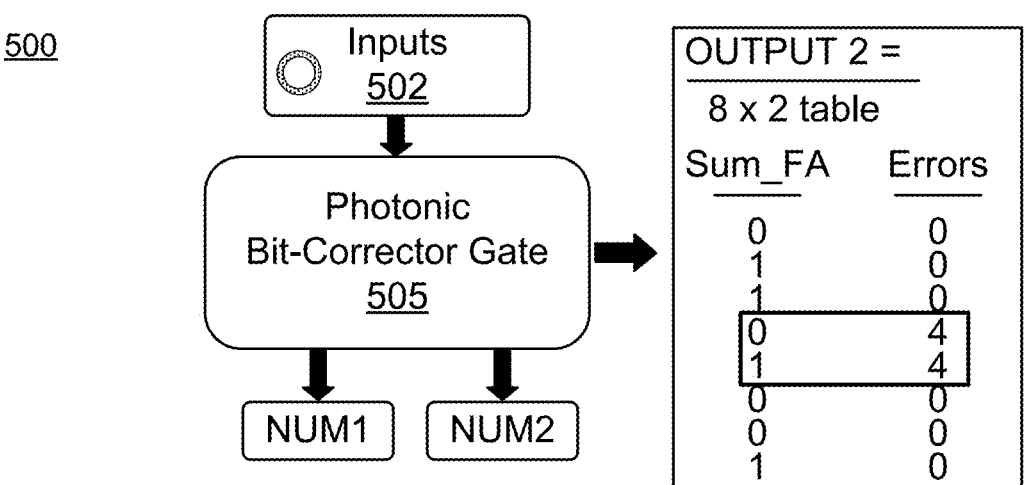
FIG. 5A illustrates a first example photonic bit-corrector gate for the photonic circuit of FIG. 4, in accordance with some embodiments.

FIG. 5A illustrates an example 500 of configuring a photonic bit-corrector gate 505 for the photonic circuit 400, in accordance with some embodiments. The photonic bit-corrector gate 505 may be an embodiment of the photonic bit-corrector gate 440. The photonic bit-corrector gate 505 may be configured (e.g., programmed) to generate at least one photonic output signal (e.g., NUM1 and/or NUM2) equal to a specific label signal for one or more photonic inputs 502 applied to the photonic bit-corrector gate 505. The photonic bit-corrector gate 505 may thus output the label signal when the photonic input 502 corresponds to an erroneous result of the photonic gate 425 (i.e., an erroneous value of the output 2). As illustrated in FIG. 5A, the photonic bit-corrector gate 505 may output the label signal equal to, e.g., 4 when each erroneous input 502 is provided to the photonic bit-corrector gate 505.

Figure 5B:
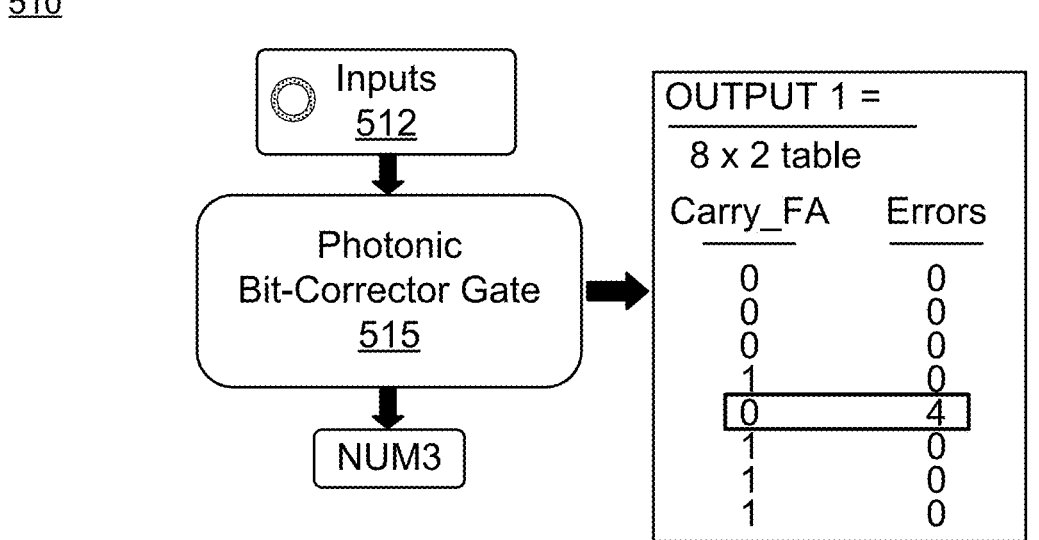
FIG. 5B illustrates a second example photonic bit-corrector gate for the photonic circuit of FIG. 4, in accordance with some embodiments.

FIG. 5B illustrates an example 510 of configuring a photonic bit-corrector gate 515 for the photonic circuit 400, in accordance with some embodiments. The photonic bit-corrector gate 515 may be an embodiment of the photonic bit-corrector gate 435. The photonic bit-corrector gate 515 may be configured (e.g., programmed) to generate a photonic output signal (e.g., NUM3) equal to a specific label signal for one or more photonic inputs 512 applied to the photonic bit-corrector gate 515. The photonic bit-corrector gate 515 may thus output the label signal when the photonic input 512 corresponds to an erroneous value of the output 1 of the photonic gate 430. As illustrated in FIG. 5B, the photonic bit-corrector gate 515 may output the label signal equal to, e.g., 4 when the erroneous input 512 is provided to the photonic bit-corrector gate 515.

Figure 5C:
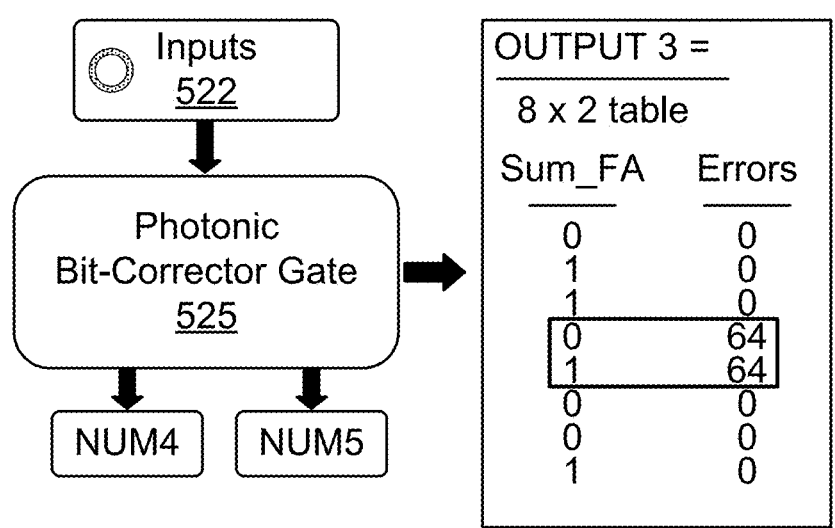
FIG. 5C illustrates a third example photonic bit-corrector gate for the photonic circuit of FIG. 4, in accordance with some embodiments.

FIG. 5C illustrates an example 520 of configuring a photonic bit-corrector gate 525 for the photonic circuit 400, in accordance with some embodiments. The photonic bit-corrector gate 525 may be an embodiment of the photonic bit-corrector gate 445. The photonic bit-corrector gate 525 may be configured (e.g., programmed) to generate at least one photonic output signal (e.g., NUM4 and/or NUM5) equal to a specific label signal for one or more photonic inputs 522 applied to the photonic bit-corrector gate 525. The photonic bit-corrector gate 525 may thus output the label signal when the photonic input 522 corresponds to an erroneous result of the photonic gate 430 (i.e., an erroneous value of the output 3). As illustrated in FIG. 5C, the photonic bit-corrector gate 525 may output the label signal equal to, e.g., 64 when each erroneous input 522 is provided to the photonic bit-corrector gate 525.

Example Process Flow

FIG. 6 is a flowchart illustrating an example method 600 for correcting errors in a photonic circuit of cascaded photonic gates using a photonic bit-corrector circuit, in accordance with some embodiments. The operations of method 600 may be performed at, e.g., the integrated circuit 100, the integrated circuit 200, the integrated circuit 300, or the integrated circuit 400. The integrated circuit may be deployed in a computing system that can further include a non-transitory computer-readable storage medium (e.g., optical, electrical, or electro-optical memory) for storing computer-executable instructions and data. The integrated circuit may be implemented as a silicon photonics platform.

The integrated circuit generates 605, via a photonic circuit including a plurality of cascaded photonic gates, a first photonic output signal for a set of photonic input signals applied to the photonic circuit. The integrated circuit applies 610 the set of photonic input signals to a photonic bit-corrector circuit to generate a second photonic output signal. The integrated circuit generates 615, via a photodetector array coupled to the photonic bit-corrector circuit, an electrical signal based on the second photonic output signal. The integrated circuit compares 620, via an electronic circuit coupled to the photodetector array, the electrical signal with a label signal. The integrated circuit outputs 625, via the electronic circuit, a corrected version of the first photonic output signal based on the comparison.

The integrated circuit may apply the set of photonic input signals to the photonic circuit and the photonic bit-corrector circuit via an array of photonic intensity modulators coupled to the photonic circuit and the photonic bit-corrector circuit. The integrated circuit may generate, via a second photodetector array coupled to an output of the photonic circuit, a second electrical signal based on the first photonic input signal generated by the photonic circuit. The integrated circuit may flip, via the electronic circuit, at least one bit in the second electrical signal based on the comparison to generate the corrected version of the first photonic output signal. The photonic bit-corrector circuit may be configured (e.g., programmed) to generate the first photonic output signal having an amplitude equal to an amplitude of the label signal for the set of photonic input signals applied to the photonic bit-corrector circuit.

A second photodetector array may be connected to an output of the photonic circuit, and an input of the electronic circuit may be connected to an output of the photodetector array and an output of the second photodetector array. An array of photonic intensity modulators may be connected to an output of the electronic circuit to generate a photonic signal based on the corrected version of the first photonic output signal.

The integrated circuit may generate, via a second photonic circuit with cascaded photonic gates connected to the array of photonic intensity modulators, a third photonic output signal for a second set of photonic input signals applied to the second photonic circuit via the array of photonic intensity modulators. The integrated circuit may generate, via a second photonic bit-corrector circuit connected to the array of photonic intensity modulators, a fourth photonic output signal for the second set of photonic input signals applied to the second photonic bit-corrector circuit via the array of photonic intensity modulators. The integrated circuit may generate, via a second photodetector array coupled to the second photonic bit-corrector circuit, a second electrical signal based on the fourth photonic output signal. The integrated circuit may compare the second electrical signal with a second label signal via a second electronic circuit coupled to the second photodetector array. The integrated circuit may output a corrected version of the third photonic output signal via the second electronic circuit based on the comparison with the second label signal.

This disclosure presents the correction of errors that may occur at a photonic circuit with cascaded photonic gates by employing bit-corrector circuits. The photonic circuit with the cascaded photonic gates may generate a first photonic output signal for a set of photonic input signals. A photonic bit-corrector circuit may generate a second photonic output signal for the same set of photonic input signals. An electronic bit-corrector circuit may then compare an electrical version of the second photonic output signal with a label signal and output a corrected version of the first photonic output signal based on the comparison. By employing the combination of photonic and electronic bit-corrector circuits, errors that may occur at the photonic circuit with cascaded photonic gates can be efficiently corrected without utilizing computationally and area-wise expensive thresholders.

ADDITIONAL CONSIDERATIONS

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to effectively convey the substance of their work to others skilled in the art. While described functionally, computationally, or logically, these operations are understood to be implemented by computer programs or equivalent electrical circuits, microcode, or the like. Furthermore, at times, it has also proven convenient to refer to these arrangements of operations as modules without loss of generality. The described operations and associated modules can be embodied in software, firmware, hardware, or some combination thereof.

Any steps, operations, or processes described herein can be performed or implemented with one or more hardware or software modules, alone or in combination with other devices. In one embodiment, a software module is implemented with a computer program product comprising a computer-readable medium containing computer program code, which a computer processor can execute for performing any or all of the steps, operations, or processes described herein.

Embodiments of the disclosure can also relate to an apparatus for performing the operations herein. This apparatus can be specially constructed for the required purposes, and/or it can comprise a general-purpose computing device selectively activated or reconfigured by a computer program stored in the computer. Such a computer program can be stored in a non-transitory, tangible computer-readable storage medium or any media suitable for storing electrical instructions coupled to a computer system bus. Furthermore, any computing systems referred to in the specification can include a single processor or architectures employing multiple processor designs for increased computing capability.

Some embodiments of the present disclosure can further relate to a system comprising a processor, at least one computer processor, and a non-transitory computer-readable storage medium. The storage medium can store computer-executable instructions, which when executed by the compiler operating on at least one computer processor, cause at least one computer processor to be operable for performing the operations and techniques described herein.

Finally, the language used in the specification has been principally selected for readability and instructional purposes, and it has not been selected to delineate or circumscribe the inventive subject matter. It is therefore intended that the scope of the disclosure be limited not by this detailed description but rather by any claims that issue on an application based hereon. Accordingly, the disclosure of the embodiments is intended to be illustrative, but not to limit the scope of the disclosure, which is set forth in the following claims.

What is claimed is:

1. An integrated circuit, comprising:
   a photonic circuit configured to:
      receive a set of photonic input signals, and
      generate a first photonic output signal for the set of photonic input signals applied to the photonic circuit;
   a photonic bit-corrector circuit configured to:
      receive the set of photonic input signals, and
      generate a second photonic output signal for the set of photonic input signals applied to the photonic bit-corrector circuit; and
   an electronic circuit coupled to the photonic circuit and the photonic bit-corrector circuit,
      the electronic circuit configured to:
         receive an electrical version of the second photonic output signal,
         receive a label signal,
         compare the electrical version of the second photonic output signal with the label signal, and
         output, based on comparing the electrical version of the second photonic output signal with the label signal, an electrical corrected version of the first photonic output signal.

2. The integrated circuit of claim 1, wherein the photonic bit-corrector circuit is further configured to:
   generate the second photonic output signal having an amplitude that is equal to an amplitude of the label signal.

3. The integrated circuit of claim 1, wherein the photonic bit-corrector circuit is further configured to:
   generate the second photonic output signal having an amplitude that is within a range of numbers defined by the label signal.

4. The integrated circuit of claim 1, further comprising:
   a first photodetector circuit connected to the photonic circuit, the photonic circuit including a plurality of cascaded photonic gates, the first photodetector circuit configured to generate, based on the first photonic output signal, a first electrical signal representing an electrical version of the first photonic output signal; and
   a second photodetector circuit connected to the photonic bit-corrector circuit, the second photodetector circuit configured to generate, based on the second photonic output signal, a second electrical signal representing the electrical version of the second photonic output signal.

5. The integrated circuit of claim 4, wherein the electronic circuit is further configured to:

flip, based on comparing the second electrical signal with the label signal, one or more bits in the first electrical signal to generate the electrical corrected version of the first photonic output signal.

6. The integrated circuit of claim 4, wherein a first input of the electronic circuit is connected to an output of the first photodetector circuit, and a second input of the electronic circuit is connected to an output of the second photodetector circuit.

7. The integrated circuit of claim 4, wherein the electronic circuit comprises:

a first comparator circuit connected to the second photodetector circuit, the first comparator circuit configured to:

compare the second electrical signal with the label signal, and generate, based on comparing the second electrical signal with the label signal, a third electrical signal;

a second comparator circuit connected to the first photodetector circuit and the first comparator circuit, the second comparator circuit configured to:

compare the first electrical signal with the third electrical signal, and generate, based on comparing the first electrical signal with the third electrical signal, the electrical corrected version of the first photonic output signal; and a driver circuit connected to the second comparator circuit, the driver circuit configured to generate a fourth electrical signal by amplifying the electrical corrected version of the first photonic output signal.

8. The integrated circuit of claim 7, wherein the first comparator circuit is further configured to:

generate the third electrical signal that is equal to logical one, when an amplitude of the second electrical signal is within a threshold from an amplitude of the label signal; and generate the third electrical signal that is equal to logical zero, when the amplitude of the second electrical signal is not within the threshold from the amplitude of the label signal.

9. The integrated circuit of claim 7, wherein the second comparator circuit is further configured to:

generate the electrical corrected version of the first photonic output signal that is equal to logical one, when an amplitude of the first electrical signal is less than an amplitude of the third electrical signal; and generate the electrical corrected version of the first photonic output signal that is equal to logical zero, when the amplitude of the first electrical signal is greater than or equal to the amplitude of the third electrical signal.

10. The integrated circuit of claim 7, further comprising:

a modulator circuit connected to the driver circuit, the modulator circuit configured to generate a photonic output signal based on the fourth electrical signal, the photonic output signal representing a corrected version of the first photonic output signal.

11. The integrated circuit of claim 4, wherein the electronic circuit comprises:

a first de-serializer circuit connected to the first photodetector circuit, the first de-serializer circuit configured to generate a third electrical signal by de-serializing the first electrical signal;

a second de-serializer circuit connected to the second photodetector circuit, the second de-serializer circuit configured to generate a fourth electrical signal by de-serializing the second electrical signal;

a first comparator circuit connected to the second de-serializer circuit, the first comparator circuit configured to:

compare the fourth electrical signal with the label signal, and generate, based on comparing the fourth electrical signal with the label signal, a fifth electrical signal;

a second comparator circuit connected to the first de-serializer circuit and the first comparator circuit, the second comparator circuit configured to:

compare the third electrical signal with the fifth electrical signal, and generate, based on comparing the third electrical signal with the fifth electrical signal, the electrical corrected version of the first photonic output signal; and a driver circuit connected to the second comparator circuit, the driver circuit configured to generate a sixth electrical signal by amplifying and serializing the electrical corrected version of the first photonic output signal.

12. The integrated circuit of claim 11, further comprising:

a modulator array connected to the driver circuit, the modulator array configured to generate a photonic output signal based on the sixth electrical signal, the photonic output signal representing a corrected version of the first photonic output signal.

13. An integrated circuit, comprising:

a photonic circuit including:

one or more first inputs connected to a first set of optical connections, the one or more first inputs configured to receive, via the first set of optical connections, a set of photonic input signals, and a plurality of photonic gates configured to generate a first photonic output signal for the set of photonic input signals applied to the one or more first inputs;

a photonic bit-corrector circuit including:

one or more second inputs connected to a second set of optical connections, the one or more second inputs configured to receive, via the second set of optical connections, the set of photonic input signals, and a photonic gate configured to generate a second photonic output signal for the set of photonic input signals applied to the one or more second inputs; and an electronic circuit including:

a first input connected to a first electrical connection, the first input configured to receive, via the first electrical connection, an electrical version of the second photonic output signal, a second input connected to a second electrical connection, the second input configured to receive, via the second electrical connection, a label signal, and one or more electrical circuits configured to:

compare the electrical version of the second photonic output signal with the label signal, and output, based on comparing the electrical version of the second photonic output signal with the label signal, an electrical corrected version of the first photonic output signal.

14. The integrated circuit of claim 13, further comprising:

a first photodetector circuit having an input connected to an output of the photonic circuit and configured to receive the first photonic output signal, the first photodetector circuit configured to generate, based on the first photonic output signal, a first electrical signal representing an electrical version of the first photonic output signal; and a second photodetector circuit having an input connected to an output of the photonic bit-corrector circuit and configured to receive the second photonic output signal, the second photodetector circuit configured to generate, based on the second photonic output signal, a second electrical signal representing the electrical version of the second photonic output signal.

15. The integrated circuit of claim 14, wherein:

the first input of the electronic circuit is connected, via the first electrical connection, to an output of the first photodetector circuit; and the second input of the electronic circuit is connected, via the second electrical connection, to an output of the second photodetector circuit.

16. The integrated circuit of claim 14, wherein the electronic circuit comprises:

a first comparator circuit having a first set of inputs, a first input of the first set of inputs connected to an output of the second photodetector circuit and configured to receive the second electrical signal, a second input of the first set of inputs configured to receive the label signal, the first comparator circuit configured to:

compare the second electrical signal with the label signal, and generate, based on comparing the second electrical signal with the label signal, a third electrical signal;

a second comparator circuit having a second set of inputs, a first input of the second set of inputs connected to an output of the first photodetector circuit and configured to receive the first electrical signal, a second input of the second set of inputs connected to an output of the first comparator circuit and configured to receive the third electrical signal, the second comparator circuit configured to:

compare the first electrical signal with the third electrical signal, and generate, based on comparing the first electrical signal with the third electrical signal, the electrical corrected version of the first photonic output signal; and a driver circuit having an input connected to an output of the second comparator circuit, the driver circuit configured to generate a fourth electrical signal by amplifying the electrical corrected version of the first photonic output signal.

17. The integrated circuit of claim 16, further comprising:

a modulator circuit having an input connected to an output of the driver circuit, the modulator circuit configured to generate a photonic output signal based on the fourth electrical signal, the photonic output signal representing a corrected version of the first photonic output signal.

18. The integrated circuit of claim 14, wherein the electronic circuit comprises:

a first de-serializer circuit having an input connected to an output of the first photodetector circuit and configured to receive the first electrical signal, the first de-serializer circuit configured to generate a third electrical signal by de-serializing the first electrical signal;

a second de-serializer circuit having an input connected to an output of the second photodetector circuit and configured to receive the second electrical signal, the second de-serializer circuit configured to generate a fourth electrical signal by de-serializing the second electrical signal;

a first comparator circuit having a first set of inputs, a first input of the first set of inputs connected to an output of the second de-serializer circuit and configured to receive the fourth electrical signal, a second input of the first set of inputs configured to receive the label signal, the first comparator circuit configured to:

compare the fourth electrical signal with the label signal, and generate, based on comparing the fourth electrical signal with the label signal, a fifth electrical signal;

a second comparator circuit having a second set of inputs, a first input of the second set of inputs connected to an output of the first de-serializer circuit, a second input of the second set of inputs connected to an output of the first comparator circuit, the second comparator circuit configured to:

compare the third electrical signal with the fifth electrical signal, and generate, based on comparing the third electrical signal with the fifth electrical signal, the electrical corrected version of the first photonic output signal; and a driver circuit having an input connected to an output of the second comparator circuit and configured to receive the electrical corrected version of the first photonic output signal, the driver circuit configured to generate a sixth electrical signal by amplifying and serializing the electrical corrected version of the first photonic output signal.

19. The integrated circuit of claim 18, further comprising:

a modulator array having a set of inputs connected to an output of the driver circuit and configured to receive the sixth electrical signal, the modulator array configured to generate a photonic output signal based on the sixth electrical signal, the photonic output signal representing a corrected version of the first photonic output signal.

20. A non-transitory computer-readable storage medium comprising stored instructions that, when executed by at least one processor, cause the at least one processor to:

instruct a photonic circuit to:

receive a set of photonic input signals, and generate a first photonic output signal for the set of photonic input signals applied to the photonic circuit;

instruct a photonic bit-corrector circuit to:

receive the set of photonic input signals, and generate a second photonic output signal for the set of photonic input signals applied to the photonic bit-corrector circuit; and instruct an electronic circuit coupled to the photonic circuit and the photonic bit-corrector circuit to:

receive an electrical version of the second photonic output signal, receive a label signal, compare the electrical version of the second photonic output signal with the label signal, and output, based on comparing the electrical version of the second photonic output signal with the label signal, an electrical corrected version of the first photonic output signal.

* * * * *